United States Patent [19]
Lee et al.

[11] Patent Number: 5,935,876
[45] Date of Patent: Aug. 10, 1999

[54] VIA STRUCTURE USING A COMPOSITE DIELECTRIC LAYER

[75] Inventors: Chiarn-Lung Lee; Wei-Kun Yeh, both of Hsinchu; Shyh-Jen Guo, Taichung, all of Taiwan

[73] Assignee: Taiwan Semiconductor Manufacturing Co., Ltd., Hsinchu, Taiwan

[21] Appl. No.: 08/872,655

[22] Filed: Jun. 10, 1997

[51] Int. Cl.$^6$ ........................................... H01L 21/00
[52] U.S. Cl. .................. 438/738; 438/723; 438/743; 438/637
[58] Field of Search .................... 438/723, 738, 438/743, 751, 756, 637, 672; 216/67, 79, 18, 39, 56

[56] References Cited

U.S. PATENT DOCUMENTS

| | | | |
|---|---|---|---|
| 4,372,034 | 2/1983 | Bohr | 438/738 X |
| 5,219,791 | 6/1993 | Freiberger | 438/756 X |
| 5,234,864 | 8/1993 | Kim et al. | 438/734 X |

*Primary Examiner*—William Powell
*Attorney, Agent, or Firm*—Christensen O'Connor Johnson & Kindness PLLC

[57] ABSTRACT

A method for forming a semiconductor device having a via by using a composite dielectric layer is disclosed. The method includes forming a first dielectric layer over a first conductive layer disposed on a substrate, where the first dielectric layer has a first etch rate. A second dielectric layer is then formed on the first dielectric layer, where the second dielectric layer has a second etch rate higher than the first etch rate. The second dielectric layer is isotropically removed by masking and etching to form a rounded contoured recess in the second dielectric layer using the first dielectric layer as an etch stop layer. The first dielectric layer is anisotropically removed by masking and etching to form the via in the first dielectric layer, where the bottom of the rounded contoured recess is aligned to the via.

5 Claims, 3 Drawing Sheets

VIA STRUCTURE USING A COMPOSITE DIELECTRIC LAYER

TECHNICAL FIELD OF THE INVENTION

The present invention relates to a method for forming a semiconductor device having a via, and more particularly, to a method for forming a semiconductor device having a via by using a composite oxide layer.

BACKGROUND OF THE INVENTION

In large scale (LSI) and very large scale (VLSI) integrated circuit technologies, it is common to have multiple metallic layers interconnected over the surface of an integrated circuit. An insulative dielectric is formed between each metallic layer. Electrical contact vias are formed between metallic layers by forming via holes in the dielectric layer to expose the underlying metallic layer for contact. FIG. 1 shows the cross-sectional view of a conventional structure of a semiconductor device with a via 10. A dielectric layer 12 is disposed on a metallic layer 14. A via opening is then formed in the dielectric layer 12. The via 10 extends vertically downward such that the entire sidewall of the via 10 is oriented perpendicular to the underlying metallic layer 14. A succeeding metallic layer 16 is then formed over the dielectric layer 12 and on the sidewall of the via 10. Due to limits in the step coverage of the metallic layer 16, the thickness of the metallic layer 16 is much greater at the center of the via 10 than at the corners 17 and 18 of the via 10. Consequently, unwanted crevices or cusps 11 and 13 in the metallic layer 16 are produced in the corners 17 and 18 of the via 10. These crevices 11 and 13 may cause disconnection between the metallic layer 16 and the underlying metallic layer 14.

In order to overcome this problem, another prior art method is provided as shown in FIG. 2. In this method, a dielectric layer 22 is disposed on a metallic layer 24. A rounded contoured recess 20 is formed by a wet etch in an upper part of the dielectric layer 22, and followed by forming a steep recess 21 by a dry etch until the surface of the metallic layer 24 is exposed. The cross-sectional area of the steep recess 21 is smaller than that of the rounded contoured recess 20. A succeeding metallic layer 26 is then formed over the dielectric layer 22 and on the sidewalls of the rounded contoured recess 20 and the steep recess 21. The disconnection problem caused by the crevices in the metallic layer is substantially reduced in this method. Unfortunately, the timely control of forming the rounded contoured recess 20 is difficult to achieve. For example, a thickness of 3000 angstroms is etched using 10:1 buffered oxide etch (BOE) in just 46 seconds.

SUMMARY OF THE INVENTION

In accordance with the present invention, a method is provided for forming a semiconductor device having a via using a composite dielectric layer. In one embodiment, the method includes forming a first plasma enhanced (PE) oxide layer over a first conductive layer disposed on a substrate, where the first PE oxide layer has a first wet etch rate. A second PE oxide layer is then formed on the first PE oxide layer, where the second PE oxide layer has a second wet etch rate higher than the first wet etch rate. The second PE oxide layer is isotropically removed by masking and wet etching to form a rounded contoured recess in the second PE oxide layer. The first PE oxide layer is anisotropically removed by masking and dry etching to form the via in the first PE oxide layer, where the bottom of the rounded contoured recess is aligned to the via.

The resultant semiconductor device having a via using a composite oxide layer according to the present invention includes a first conductive layer disposed on a substrate. A first PE oxide layer having a first wet etch rate is formed over the first conductive layer, where the first PE oxide layer include a steep recess extending from surface of the first conductive layer to top of the first PE oxide layer. The present invention also includes a second PE oxide layer having a second wet etch rate higher than the first wet etch rate, where the second PE oxide layer is formed on the first PE oxide layer, and the second PE oxide layer includes a rounded contoured recess, wherein bottom of the rounded contoured recess is aligned to the steep recess in the first PE oxide layer.

DETAILED DESCRIPTION OF THE PREFERRED EMBODIMENT

Figure 1:
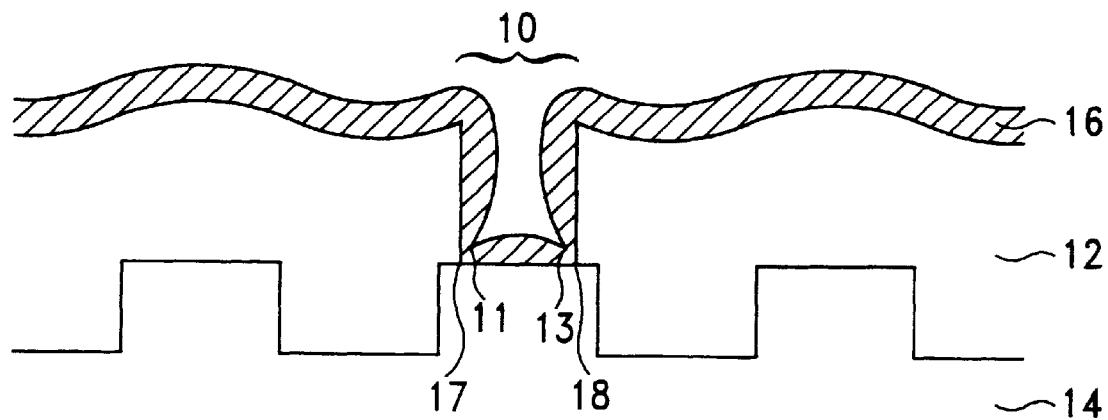
FIG. 1 shows a cross-sectional view of a conventional structure of a semiconductor device with a via.
Figure 2:
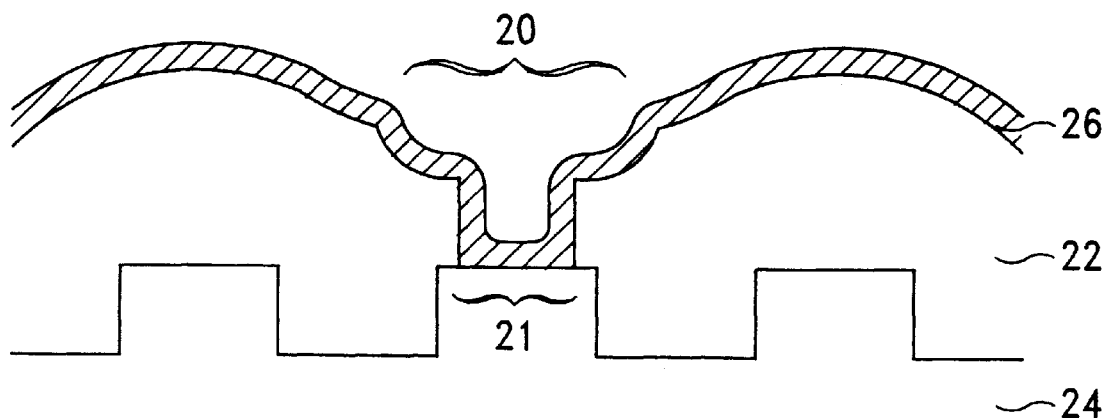
FIG. 2 shows a cross-sectional view of another conventional structure of a semiconductor device with a via.
Figure 3:
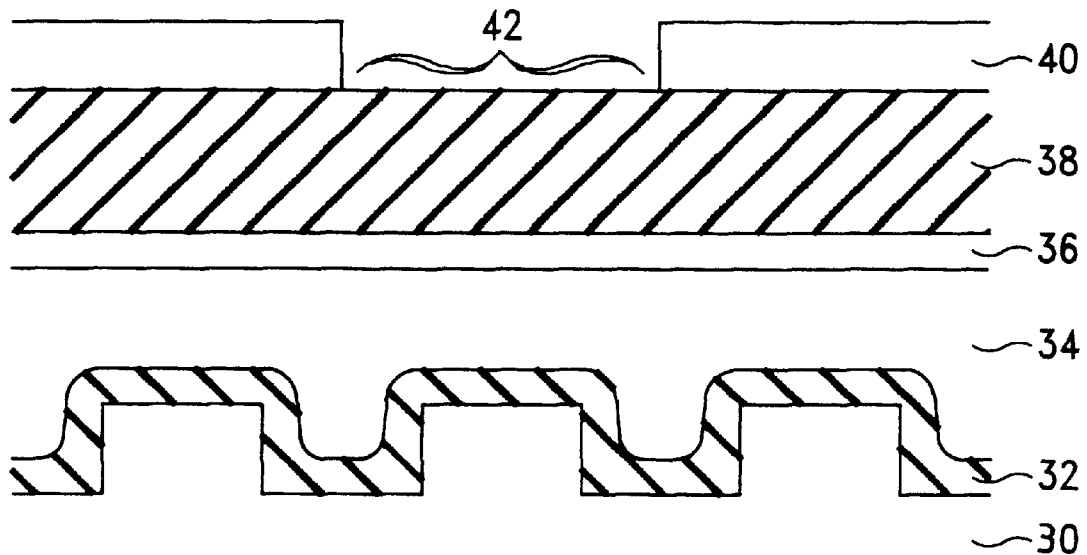
FIGS. 3, 4, 5, and 6 show cross-sectional views illustrative of various stages in the fabrication of a semiconductor device having a via in accordance with the present invention.

Referring to FIG. 3, a first metallic layer 30 is deposited on an underlying substrate (not shown in the diagram). This first metallic layer 30 is usually formed by a conventional sputter method. Next, a silicon oxide layer 32 is deposited over the first metallic layer 30 to a thickness of about 2000–3000 angstroms. In this embodiment, the silicon oxide layer 32 is formed using a conventional plasma enhanced chemical vapor deposition (PECVD).

Next, an oxide layer 34 made by the spin-on-glass (SOG) technique is optionally applied on the surface of the silicon oxide layer 32. The coating of this SOG oxide layer 34 planarizes the surface of the silicon oxide layer 32. In this embodiment, the entire thickness of the SOG oxide layer 34 is about 4600 angstroms.

A thin PECVD silicon oxide layer 36 is then formed on the surface of the SOG oxide layer 34 to a thickness of about 1500 angstroms. This thin silicon oxide layer 36 is used as a stop layer, which will be described later. The wet etch rate of the thin silicon oxide layer 36 is maintained in a range of about 1500–2500 angstroms/minute, for example, by applying higher SiH4 flow rate and radio frequency power, while lowering gap spacing or pressure during deposition.

Afterwards, a thick silicon oxide layer 38 is deposited over the buffer layer 36 to a thickness of about 2000–4000 angstroms. In this embodiment, the thick silicon oxide layer 38 is formed using a conventional plasma enhanced chemical vapor deposition (PECVD). The wet etch rate of the thick silicon oxide layer 38 (about 3500–4500 angstroms/minute) is made higher than that of the thin silicon oxide layer 36. This wet etch rate is achieved, for example, by controlling $SiH_4$ flow rate, radio frequency power, gap spacing and pressure during deposition. It is noted that the thin silicon oxide layer 36 and the thick silicon oxide layer 38 are formed in the same process equipment, thereby reducing fabrication cost, and preventing wafer contamination associated with a change in process.

Figure 4:
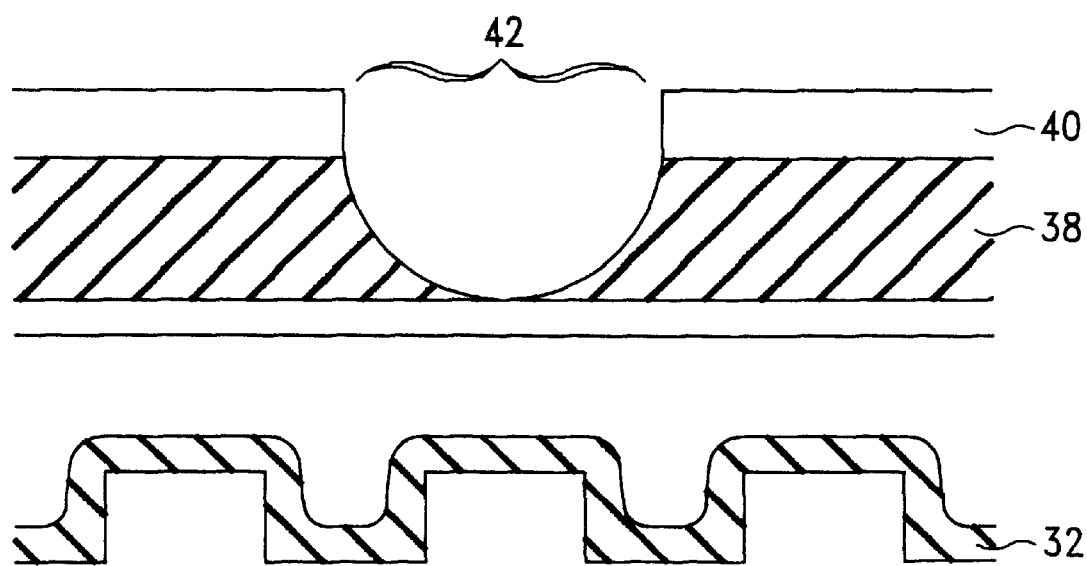

Next, conventional photolithography techniques are used to define an area 42 in a photoresist layer 40 applied on the thick silicon oxide layer 38. Using the photoresist layer 40 as an etch mask, the thick silicon oxide layer 38 is isotropically etched to form a rounded contoured recess 42 in the thick silicon oxide layer 38 as shown in FIG. 4, wherein the thin silicon oxide layer 36 acts as an etch stop layer. In this embodiment, a 10:1 buffered oxide etch (BOE) etchant is used to form the recess 42.

Figure 5:
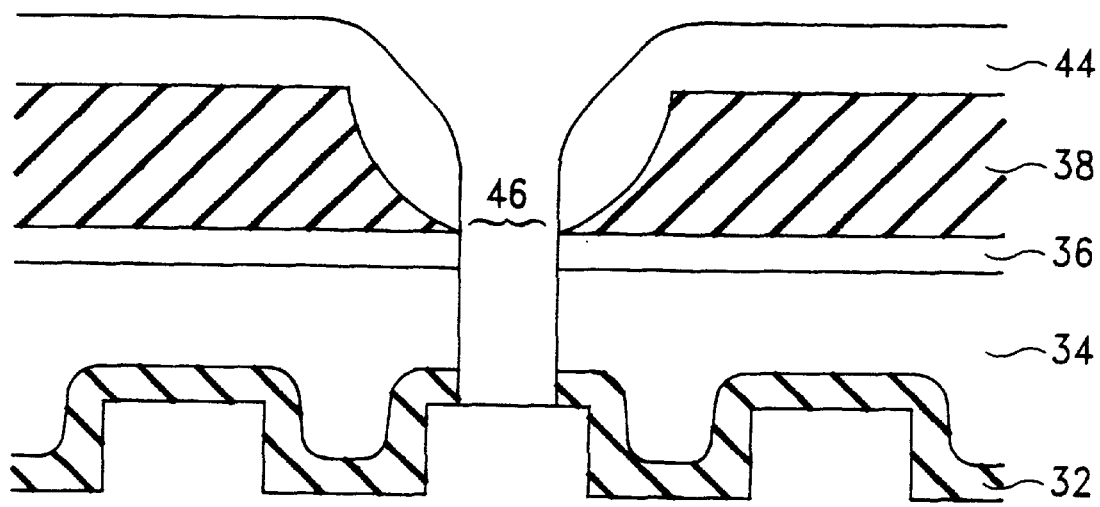

Conventional photolithography techniques are then used to define a via 46 in a photoresist layer 44 applied on the thick silicon oxide layer 38. Using the photoresist layer 44 as an etch mask, the silicon oxide layer 32, the SOG layer 34 and the thin oxide layer 36 are anisotropically etched to form via 46 shown in FIG. 5. The cross-sectional area of the bottom of the rounded contoured recess 42 is approximately aligned to the cross-sectional area of the via 46. In this embodiment, a dry etch, such as plasma etching process, is used to form the via hole 46. The via hole 46 thus formed has steep sidewalls.

Figure 6:
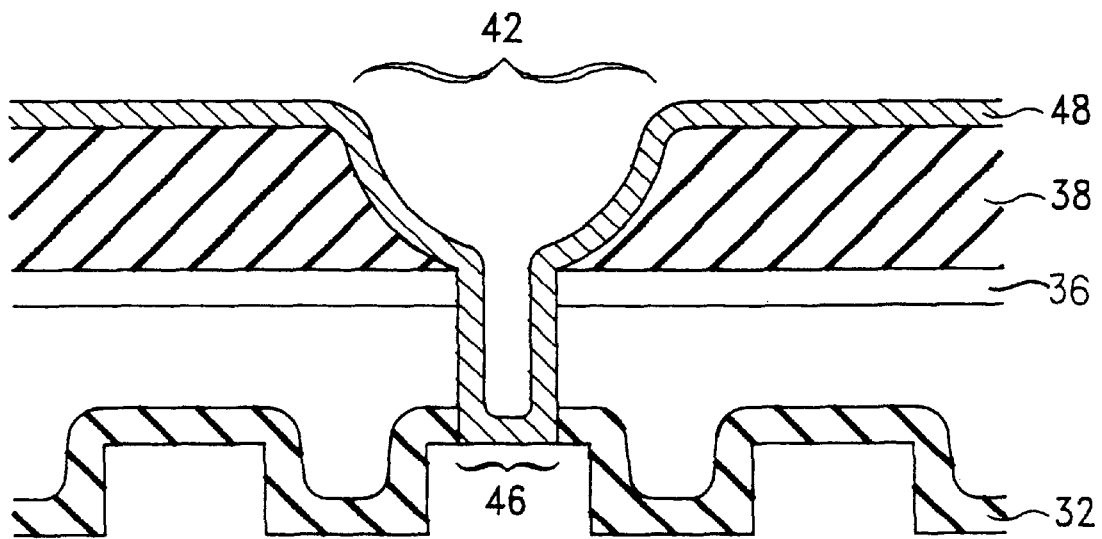

To complete the formation of interconnection of metallization through the via hole 46, a conformal second metallic layer 48 is formed on the sidewall of the rounded contoured recess 42 and the via hole 46 as shown in FIG. 6. Due to the use of the two-step etch process on the composite silicon layer, i.e., the thin silicon oxide layer 36 and the thick silicon oxide layer 38, a conformal metallic layer 48 can be obtained without crevices in the corners of the via 46 and the overetching problem.

Although specific embodiments have been illustrated and described, it will be obvious to those skilled in the art that various modifications may be made without departing from the spirit which is intended to be limited solely by the appended claims. For example, the thin silicon oxide layer 36 and the thick silicon oxide layer 38 can be replaced by other material provided that these two layer 36 and 38 can be made by the same process but different etch rate.

What is claimed is:

1. A method for forming a via hole, said method comprising:

forming a first oxide layer on a first conductive layer;

forming a spin on glass oxide (SOG) layer on said first oxide layer;

forming a second oxide layer on said SOG layer by a first plasma enhanced chemical vapor deposition (PECVD) process;

forming a third oxide layer on said second oxide layer by a second PECVD process, said first PECVD process having a higher $SiH_4$ flow rate, a higher radio frequency power, and a lower gap spacing than said second PECVD process applied resulting in said third oxide layer having an etch rate two to three times higher than said second oxide layer;

forming a first photoresist layer on said third oxide layer with an opening to define a via hole position, said opening having a cross-sectional size larger than said via hole so as to form a rounded contoured recess portion in said third oxide layer;

isotropically removing said third oxide layer to form said rounded contoured recess in said third oxide layer using said second oxide layer as an etch stop layer and said photoresist layer as a mask;

forming a second photoresist layer with an opening on said rounded contoured recess of said second oxide layer, the bottom of said second photoresist layer being aligned to said via hole;

anisotropically removing said second oxide layer, said SOG layer and said first oxide layer down to said first conductive layer by a dry etch;

stripping said second photoresist layer and said first photoresist layer; and conformally forming a second conductive layer on the bottom and sidewalls of said via hole.

2. The method according to claim 1, wherein said third oxide layer is isotropically removed by a wet etching.

3. The method according to claim 1, wherein said third oxide layer has a thickness of about 200–400 nm.

4. The method according to claim 1, wherein said second oxide layer has a thickness of about 150 nm.

5. A method for forming a via hole, said method comprising:

forming a first oxide layer on a first conductive layer;

forming a spin on glass oxide (SOG) layer on said first oxide layer;

forming a second oxide layer to a thickness of about 1500 angstroms on said SOG layer by a first plasma enhanced chemical vapor deposition (PECVD) process;

forming a third oxide layer to a thickness of about 2000–4000 angstroms on said second oxide layer by a second PECVD process, said first PECVD process having a higher $SiH_4$ flow rate, a higher radio frequency power, and a lower gap spacing than said second PECVD process resulting in said third oxide layer having an etch rate two to three times higher than said second oxide layer;

forming a first photoresist layer on said third oxide layer with an opening to define a via hole position, said opening having a cross-sectional size larger than said via hole so as to form a rounded contoured recess portion in said third oxide layer;

isotropically removing said second oxide layer to form said rounded contoured recess in said third oxide layer using said second oxide layer as an etch stop layer and said photoresist layer as a mask;

forming a second photoresist layer with an opening on said rounded contoured recess of said second oxide layer, the bottom of said second photoresist layer being aligned to said via hole;

anisotropically removing said second oxide layer, said SOG layer and said first oxide layer down to said first conductive layer by a dry etch;

stripping said second photoresist layer and said first photoresist layer; and conformally forming a second conductive layer on the bottom and sidewalls of said via hole.

* * * * *